United States Patent
Andersson et al.

(10) Patent No.: US 6,946,983 B2
(45) Date of Patent: Sep. 20, 2005

(54) DIGITAL-TO-ANALOG CONVERTER HAVING ERROR CORRECTION

(75) Inventors: Ola Andersson, Svedala (SE); Jacob Wikner, Vikingstad (SE)

(73) Assignee: Telefonaktiebolaget L M Ericcson, Stockholm (SE)

( * ) Notice: Subject to any disclaimer, the term of this patent is extended or adjusted under 35 U.S.C. 154(b) by 0 days.

(21) Appl. No.: 10/972,947

(22) Filed: Oct. 25, 2004

(65) Prior Publication Data

US 2005/0083219 A1 Apr. 21, 2005

Related U.S. Application Data

(63) Continuation of application No. PCT/SE03/00595, filed on Apr. 14, 2003.

(30) Foreign Application Priority Data

Apr. 26, 2002 (SE) .............................................. 0201272

(51) Int. Cl.$^7$ ................................................. H03M 1/06
(52) U.S. Cl. .......................... 341/118; 341/144; 341/143
(58) Field of Search ................................ 341/118, 120, 341/144, 145, 136, 133, 143

(56) References Cited

U.S. PATENT DOCUMENTS

| | | | | |
|---|---|---|---|---|
| 5,838,272 A | * | 11/1998 | Steiner et al. | 341/143 |
| 5,926,123 A | * | 7/1999 | Ostrom et al. | 341/120 |
| 5,936,561 A | * | 8/1999 | Lee | 341/143 |
| 6,229,466 B1 | * | 5/2001 | Gattani | 341/120 |
| 6,232,899 B1 | | 5/2001 | Craven | 341/126 |
| 6,271,781 B1 | * | 8/2001 | Pellon | 341/143 |
| 6,404,369 B1 | * | 6/2002 | Sheen | 341/143 |

FOREIGN PATENT DOCUMENTS

EP   1 033 817 A1   1/1998 ............ H03M/1/10

* cited by examiner

Primary Examiner—John B Nguyen
(74) Attorney, Agent, or Firm—Baker Botts L.L.P.

(57) ABSTRACT

The values X(n) input to a current-steering digital-to-analog converter (49) are modified (41) before the actual conversion to compensate for conversion errors of the digital-to-analog converter. The input values are modified according to a model (43) of the digital-to-analog converter in which each output value of the digital-to-analog converter Y(n) is a sum of a desired value directly proportional to the respective input value and an error. The error is a product of the settled output value, i.e. the difference between the desired value and the previous output value Y(n−1) actually provided by the digital-to-analog converter, and a relative step error that is a function only of the respective input signal and is stored in a table. The relative step error can be a function also of the previous output signal and of the previous input signal. This model has a low complexity and is suitable for on-chip implementation.

9 Claims, 5 Drawing Sheets

US 6,946,983 B2

DIGITAL-TO-ANALOG CONVERTER HAVING ERROR CORRECTION

CROSS-REFERENCE TO RELATED APPLICATION

This application is a continuation of copending International Application No. PCT/SE03/00595 filed Apr. 14, 2003 which designates the United States, and claims priority to Swedish application no. 0201272-2 filed Apr. 26, 2002.

TECHNICAL FIELD OF THE INVENTION

The present invention relates to current-steering digital-to-analog converters (DACs) having error correction.

BACKGROUND

Digital-to-analog converters are used in many electronic devices providing an electrical output signal or a physical non-electrical output signal. Such devices include e.g. electronic digital devices having antennas for transmitting electromagnetic waves or for providing audible signals such as mobile telephones and CD players. A DAC receives at periodically repeated times an input digital signal and provides at times somewhat after said repeated times an output signal, such as an electric voltage or current, having a magnitude that should be proportional to a value that the previous input signal represents. The time period between said periodically repeated times has a length called the updating period time.

Besides e.g. component mismatch, an important limiting factor affecting the linearity of current-steering DACs is the nonideal behavior of current sources and switches due to parasitic resistances and capacitances. This problem has been discussed in J. J. Wikner and N. Tan, "Modeling of CMOS digital-to-analog converters for telecommunication", IEEE Trans. on Circuits and Systems II, Vol. 46, No. 5, pp. 489–499, May 1999, A. van den Bosch, M. Steyaert, and W. Sansen, "SFDR-bandwidth limitations for high speed high resolution current steering CMOS D/A converters", Proc. 6th IEEE Int. Conf. on Electronics, Circuits, and Systems, Vol. 3, 1999, pp.1193–1196, J. J. Wikner and N. Tan, "Influence of Circuit Imperfections on the Dynamic Performance of DACs", NorChip'97 Conference, Tallinn, Estonia, November 1997, K. O. Andersson and J. J. Wikner, "Characterization of a CMOS current-steering DAC using state-space models", Proc. IEEE 2000 Midwest Symposium on Circuits and Systems, MWSCAS'00, Lansing, Mich., USA, August 2000, J. J. Wikner, "Studies on CMOS Digital-to-Analog Converters", Linkoping Studies in Science and Technology, Dissertation No. 667, ISBN 91-7219-910-5, 2001, and M. Gustavsson, J. J. Wikner, and N. Tan, "CMOS dataconverters for communications", Kluwer Academic Publishers, 2000.

The influence of the parasitic capacitances at the output nodes of the current sources and current switches is often the most crucial, yielding a dynamic nonlinearity that "grows" with increasing signal frequency, e.g. for a single-tone input signal the third-order harmonic term increases with 15–20 dB/decade of increasing signal frequency, see the three last articles cited above. This normally holds for higher frequencies where the output values of a DAC cannot be approximated by a memory-less expression.

SUMMARY OF THE INVENTION

It is an object of the invention to provide a low-complexity model of the phenomenon described above.

It is another object of the invention to provide a model allowing a relatively cheap on-chip implementation to be used in an error compensation system.

It is another object of the invention to provide a settling error correction technique and a DAC having correction means for correcting settling errors.

Thus generally, for compensating errors in a DAC the input values to the DAC are modified before entering the DAC so that errors are reduced. The modifying of the input values is made to compensate for errors produced according to a particular model. According to the model each output value of the DAC is a sum of a desired value directly proportional to the respective input value and an error being a product of the settled output value, i.e. the difference between the desired value and the previous output value actually provided by the DAC, and a relative step error that is a function only of the respective input signal.

BRIEF DESCRIPTION OF THE DRAWINGS

The invention will now be described by way of non-limiting embodiments with reference to the accompanying drawings in which.

DETAILED DESCRIPTION

The Ideal Current-steering DAC

Figure 1:
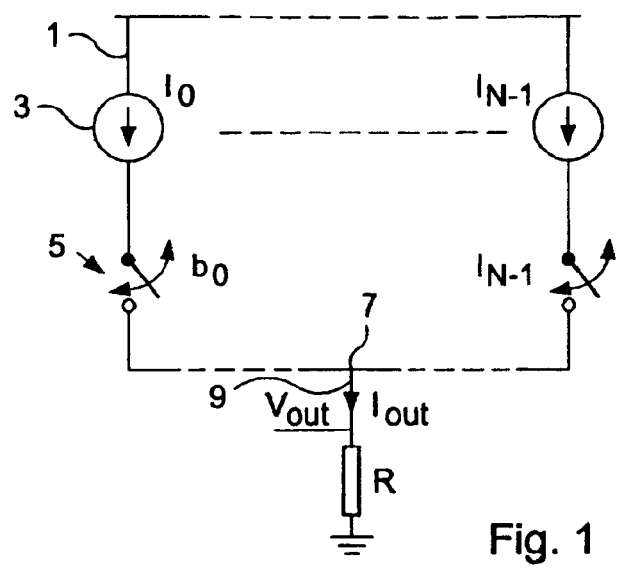
FIG. 1 is a circuit diagram of an ideal current-steering digital-to-analog converter.

A schematic circuit diagram of an ideal current-steering digital-to-analog converter is shown in FIG. 1. In N parallel lines 1 current sources 3 providing current intensities $I_0$, $I_1$, ..., $I_N$ are connected. Controlled switches 5 are also connected in the lines 1 that at their output ends are connected to a common node 7 also coupled to an output line 9 in which the output current intensity $I_{out}$ is provided to a load or termination resistance R. The output voltage at the node 7 is $V_{out}$. The switches 5 are controlled by input electrical signals representing a digital input vector $X=[b_{N-1}, ..., b_0]$, which in turn represents an integer value $$X = \sum_{i=0}^{N-1} b_i \cdot w_i,$$

where $w_i$ is the weight of $b_i$, the $w_i$ in most cases being integer numbers, and $b_i \in \{0,1\}$. In the following the letter X will be used to represent both the integer value and the vector, since the risk for confusion is small. The desired operation for the DAC is to construct an output current, or voltage, that is proportional to X, i.e., $$I_{out} = \sum_{i=0}^{N-1} b_i \cdot w_i \cdot I_{unit} = X \cdot I_{unit} \text{ or} \quad (1)$$

$$V_{out} = R \sum_{i=0}^{N-1} b_i \cdot w_i \cdot I_{unit} = R \cdot X \cdot I_{unit}$$

If the schematic picture of FIG. 1 is analyzed it is found that this operation is achieved if the switch 5 in line 1 having No. i is ON when $b_i=1$, and is OFF when $b_i=0$, since the currents from the current sources 3 are summed according to the Kirchhoff current law.

Figures 2A, 2B, 2C:
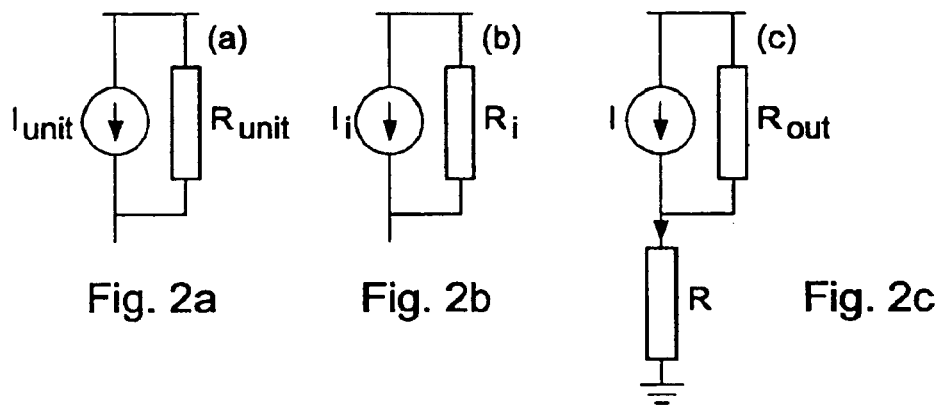
FIG. 2a is an equivalent circuit model of a unit current source having an inner resistance.
FIG. 2b is an equivalent circuit model of a general current source having an inner resistance.
FIG. 2c is an equivalent circuit model connected to a load and comprising current sources that have inner resistances.

Now the case is considered where the current sources 3 are nonideal. The output or apparent resistance of a unit current source, i.e. a current source having the weight $w=1$, is set to $R_{unit}$, as indicated in the schematic diagram of FIG. 2a. A general current source providing a current intensity $I_i$ having the weight $w_i$ is constructed by connecting $w_i$ equal unit current sources in parallel and then the corresponding output resistance is $$R_i = \frac{R_{unit}}{w_i} \quad (2)$$

as indicated in FIG. 2b.

If the DAC is considered for a certain given input value X, the equivalent circuit of FIG. 2c can be analyzed. The equivalent current becomes $$I = I_{unit} X \quad (3)$$

and this is also the desired output current. The equivalent output resistance is $$R_{out} = \frac{1}{\sum_{i=0}^{N-1} b_i \cdot \frac{1}{R_i}} = \frac{R_{unit}}{\sum_{i=0}^{N-1} b_i \cdot w_i} = \frac{R_{unit}}{X} \quad (4)$$

Analyzing the circuit of FIG. 1 and solving the equations (3) and (4) yields $$I_{out} = K \cdot \frac{X}{1 + \frac{R}{R_{unit}} R \cdot X} = K \cdot \frac{X}{1 + \rho_u \cdot X} \quad (5)$$

where K is a constant and $P_u$ is the ratio between the load resistance and the output resistance of a unit current source. Even though this circuit model is too much simplified to provide an accurate expression for the input-output relationship of a real circuit, since transistors are nonlinear devices, etc., it provides a good insight regarding the need for constructing current sources having a very high, practically "infinite", output resistance in order to achieve a high degree of linearity. It should, however, be noted that achieving sufficiently high output resistance is seldom and practically never a problem if the design criterion implicitly given in the articles cited above is considered.

The finite output resistance of the current source is one of the limiting factors for the static performance of the DAC, but as already mentioned, it is not a practical problem. The dynamic behavior of the DAC that is important for high-frequency operation is, however, to a large extent influenced by the finite output capacitance of the current sources—and other parasitic capacitances as well. This has been discussed in some of the articles cited above.

Figure 3:
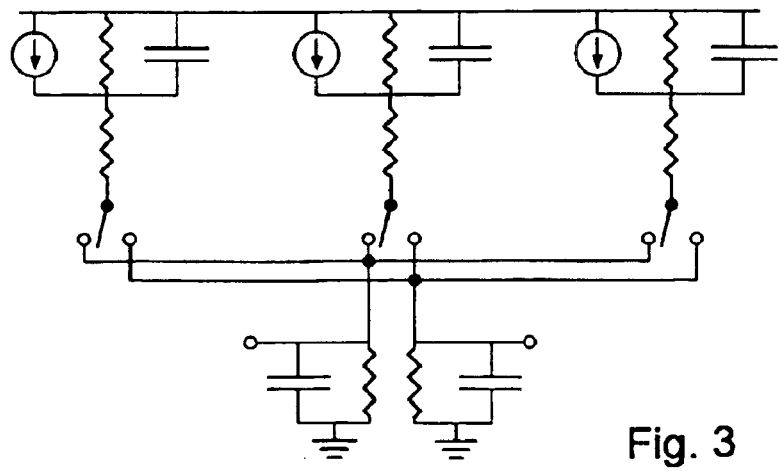
FIG. 3 is a more complicated equivalent circuit model of a digital-to-analog converter connected to a load and comprising current sources that have inner resistances.

In the cited article by Andersson and Wikner a more elaborate model is disclosed, taking into account the influence of parasitic capacitances and switch resistances. A circuit diagram according to this model is shown in FIG. 3. This model has a much better correspondence to a real DAC circuit in regard to the dynamic conversion properties. Thus, parasitic capacitances are connected in parallel to portions of the inner resistances of the current sources. A parasitic capacitance is connected in parallel to the terminal or load resistance. Also, in the switched-off positions of the switches, the switches are connected to an OFF-load comprising a resistance and capacitance connected in parallel.

In addition to the models described above, models of other nonideal factors have also been presented in the literature, e.g., the influence of component mismatch and sampling clock jitter. These phenomena are not included in the model to be described hereinafter. It is, however, not claimed that these phenomena are of no importance, but here a situation is considered where the influence of parasitic components is dominating.

Looking at the models presented above, the following can be observed: the nonlinear behavior arises from the fact that, besides the wanted or ideal current sources, a parasitic network exists, i.e., a network of parasitic components, connected to the output node. This parasitic network causes a loss of current, i.e,. a fraction of the current intended to be directed to the load is instead lost through the parasitic network.

For example, a situation can be considered in which the parasitic network is purely capacitive. In this case the DAC can be modeled, not considering the inner parasitic capacitances of the current source, by the circuit diagram of FIG. 4. The circuit differs from the circuit of FIG. 1 by a capacitor $C_X$ connected in parallel to the load resistor R. The capacitor $C_X$ represents the parasitic capacitance associated with the input code X. This is a reasonable assumption since the number of current sources, including their inherited capacitances, connected to the output is determined by the input code. For this simplified circuit model the output voltage may be given by the following differential equation:

$$V_{out}(t) = R \cdot I_{out}(t) = R \cdot \left(I_X - C_X \cdot \frac{\partial}{\partial t}V_{out}(t)\right) \quad (6)$$

where the desired output current is $$I_X = I_{unit} \cdot X. \quad (7)$$

It can be observed that Eq. (6) expresses the first-order linear settling process for all fixed codes X The general solution to this equation is $$V_{out}(t) = A \cdot e^{\frac{t}{R \cdot C_X}} + B \quad (8)$$

where A and B are determined by the physically imposed boundary conditions, commonly taken as start and end values of the settling process:

$$V_{out}(0) = V_0 \text{ (the initial voltage)} \quad (9)$$

and $$\lim_{t \to \infty} V_{out}(t) = I_X \cdot R = V_X \text{ (the desired output voltage)}, \quad (10)$$

yielding $$V_{out}(t) = V_0 + (V_X - V_0) \cdot \left(1 - e^{\frac{t}{R \cdot C_X}}\right) \quad (11)$$

The relative step error $e_{rel}(t,X)$ at the time t is defined as $$e_{rel}(t, X) = \frac{V_X - V_{out}(t)}{V_X - V_0} = 1 - \frac{V_{out}(t) - V_0}{V_X - V_0} \quad (12)$$

Using Eq. (11) it is found that $$e_{rel}(t, X) = e^{\frac{t}{R \cdot C_X}} \quad (13)$$

Some continuous-time analytical expressions for the transient behavior of the output voltage in the period between two consecutive sample instants, i.e., when X is fixed and thus $C_X$, have thus been established. For a discrete-time analysis the value of the voltage at the end of such a period is of interest, i.e., the voltage $Y(n) = V_{out}(n \cdot T)$, where n is an integer indicating the update instant and T is the updating period time.

Using Eqs. (11) and (13) it is found that $$Y(n) = V_{out}(n \cdot T) = V_{X(n)} - e_{rel}(T, X(n)) \cdot (V_X - V_{out}((n-1) \cdot T)) \quad (14)$$

Even though the relationship between Y(n) and X(n) is dynamic, i.e., depends on all previous samples of the input signal X, a signal $e_{rel}$ has been found that is a static function of the input signal X, i.e., only depends on the present value of X. Moreover, the value of $e_{rel}$ is the only thing required to calculate the output Y(n) (together with the present input X(n) and the previous output $Y(n-1) = V_{out}((n-1)T)$).

Figure 4:
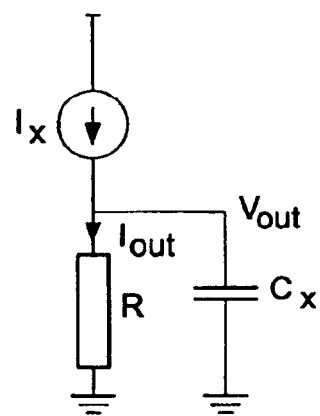
FIG. 4 is an equivalent circuit model of a digital-to-analog converter connected to a resistive load and having a purely capacitive parasitic load connected in parallel to the resistive load.

The nature of settling errors in a real implementation of a current-steering DAC according to the model circuit of FIG. 4 will now be discussed. First the output voltage $V_{out}$ is normalized, so that the desired output voltage is $V_X = X$.

Based on Eq. (14) the following assumption is made (which will be somewhat modified later on)

$$Y(n) = X(n) - e_{rel}(X(n)) \cdot (X(n) - Y(n-1)) \quad (15)$$

Generally thus, the output value at a given update instant is the desired value, X(n), plus an additional error. This additional error is a product of two factors:

the settled output step $X(n) - Y(n-1)$, and the relative step error $e_{rel}(X(n))$, which is a function of the present input signal only, i.e., is a static function of the input signal X.

Figure 5:
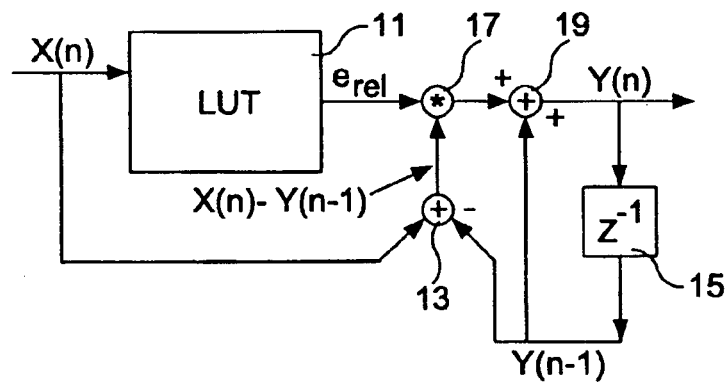
FIG. 5 is a block diagram of a model for the way in which an output value is produced in a digital-to-analog converter.

If the basic assumption according to Eq. (15) is analyzed, it is found that only the values of two variables are needed to estimate the output value, i.e., the estimate of the previous output value, $Y(n-1)$, and the present input code, $X(n)$. Further a magic box, e.g., a lookup table, is required for the estimation (evaluation) of the relative step error $e_{rel}(X(n))$. If a lookup table is used the size of the lookup table can be kept small if it assumed that the relative step error $e_{rel}(X)$ is piecewice constant over a number of values, e.g., that the relative step error $e_{rel}(X)$ is only a function of a few MSBs of X. A block diagram illustrating how the output value Y(n) depends on the input value X(n) and the previous output value Y(n-1) according to Eq. (15) is shown in FIG. 5.

Thus the input value X(n) is provided to some function block such as a look-up table (LUT) 11 to produce on the output thereof a value of the relative step error $e_{rel}(X(n))$. The input value is also provided to a first input of a first summing node 13 which on its second, inverting input receives the previous or old output value Y(n-1) that is stored in a memory or register 15. The output of the first summing node 13 is input to a multiplying node 17 that also receives the relative step error $e_{rel}(X(n))$ from the function block 11. The value obtained in the node 17 by multiplying the values on the input terminals thereof is provided to a second summing node 19 that also receives the old output value Y(n-1) from the register 15. The desired, new output value Y(n) is provided on the output terminal of the second summing node.

Figure 6A:
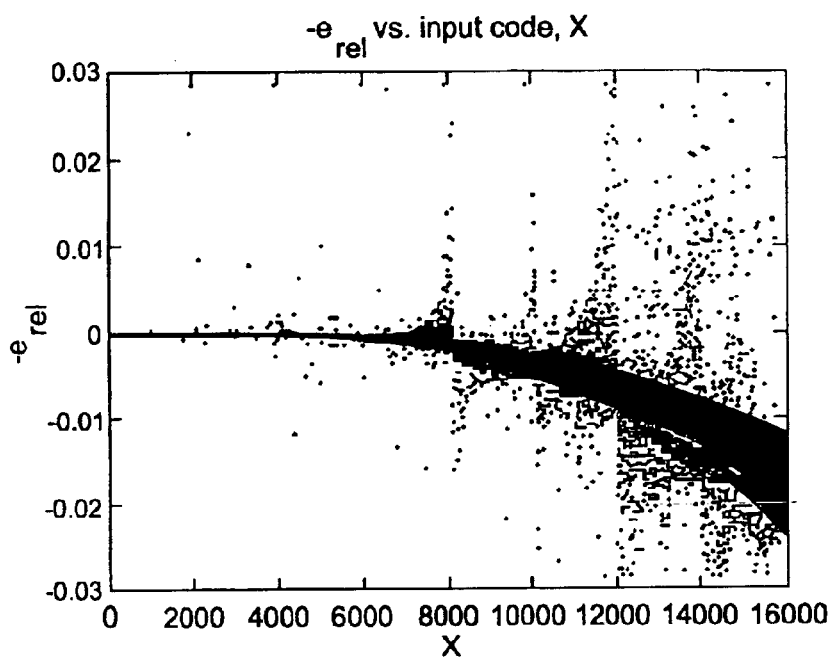
FIG. 6a is a diagram of the negative of a relative step error as a function of the input value in a digital-to-analog converter.
Figure 6B:
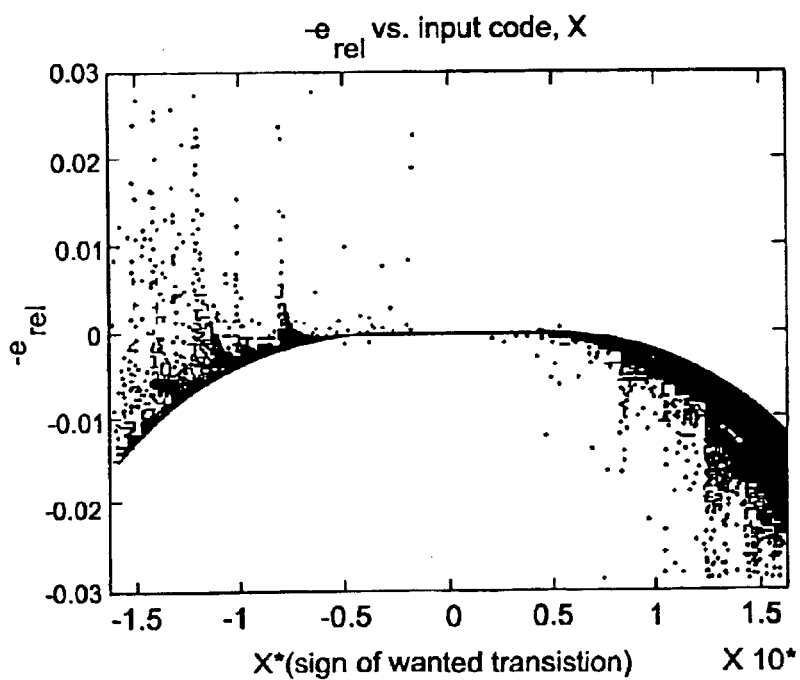
FIG. 6b is a diagram of the negative of a relative step error as a function of the product of the input value and the sign of the wanted transition in a digital-to-analog converter.

FIG. 6a is a plot of simulated values of the negative $-e_{rel}$ of the relative step error obtained by using the model disclosed in the cited article for Andersson and Wikner. The input signal is a random white noise signal having a rectangular probability density, making all signal transitions approximately equally probable. As can be seen from this plot, the assumption that the relative step error $e_{rel}$ is a function of X only, is not completely valid, since there is a spread in the values. However, it can be observed that the values of the relative step error $e_{rel}$ roughly follow a curve determined by X. If a new parameter is included, which is the sign of the wanted transition, i.e. the sign of the difference between the input value and the old output value, $sgn(X(n)-Y(n-1))$, the variance of the error introduced by the estimation is reduced. This is shown in FIG. 6b, where the negative of the relative step error $-e_{rel}$ is plotted as a function of the sign of the wanted transition multiplied by the input value or desired output value, i.e. $X(n) \cdot sgn(X(n)-Y(n-1))$.

This observation results in to some modifications of the model according to Eq. (15) and FIG. 5 yielding two alternative but similar models denoted by $M_Y$ and $M_X$ which will be described in the following.

Model $M_Y$

A straight-forward consequence of the observation above is the assumption that the relative step error $e_{rel}$ generally can be taken a function of both X(n) and Y(n-1). This is more general than stating that the relative step error $e_{rel}$ is a function of X(n) and, as suggested above, also the sign of the transition. The function block performing the estimation may again be a lookup table, and again this lookup table may, e.g., only be addressed by a few MSBs of X(n) and Y(n−1) to keep the size of the table small. A proposed block diagram illustrating this model of the DAC is shown in FIG. 7.

Figure 7:
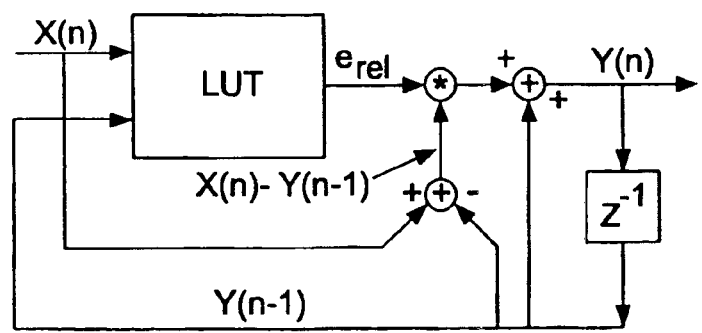
FIG. 7 is a block diagram similar to that of FIG. 5 of a modified model for the way in which an out-put value is produced in a digital-to-analog converter.

The block diagram of FIG. 7 thus differs from that of FIG. 5 in that the old output value Y(n−1) is provided as a second input to the function block 11.

Model $M_X$

The above proposed model requires that Y(n−1) is estimated before the determining or estimation of the relative step error $e_{rel}$ can start. If it is assumed that the absolute error |X(n−1)−Y(n−1)| between the old input or desired value X(n−1) and the old output value Y(n−1) is small, Y(n−1) in the estimation of the relative step error $e_{rel}$ can be replaced by X(n). This is especially reasonable if only a few MSBs of Y(n−1) are used in the estimation of the relative step error $e_{rel}$. This results in the modified block diagram of FIG. 8 illustrating how the output values of the DAC are produced.

Figure 8:
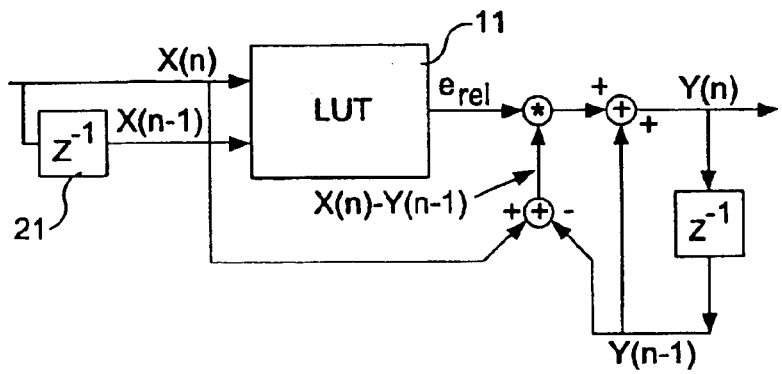
FIG. 8 is a block diagram similar to that of FIG. 5 of another modified model for the way in which an output value is produced in a digital-to-analog converter.

The block diagram of FIG. 8 thus differs from that of FIG. 5 in that the old input or desired value X(n−1) is provided as a second input to the function block 11 as stored in a second memory cell or register 21.

Now an error correction method based on the above models of the operation of current-steered DAC will be described. For simplicity the model according to the basic assumption according to Eq. (15) and FIG. 5 is used. A modified input signal $\tilde{X}(n)$ is to be determined which will result in the desired output signal Y(n)=X(n). It is then assumed that the error correction was successful at the last update instant, i.e,. that Y(n−1)=X(n−1). If the input signal $\tilde{X}(n)$ is applied the following output signal is obtained from Eq. (15):

$$Y(n)=X(n-1)+e_{rel}(\tilde{X}(n))\cdot(\tilde{X}(n)-X(n-1))$$

Setting Y(n)=X(n) gives $$\tilde{X}(n) = X(n-1) + \frac{X(n) - X(n-1)}{e_{rel}(\tilde{X}(n))}$$

If it is further assumed that the correction is small or has a not too great variation with the input signal, it can also be assumed that $$e_{rel}(\tilde{X}(n)) \approx e_{rel}(X(n))$$

resulting in $$\tilde{X}(n) = X(n-1) + \frac{X(n) - X(n-1)}{e_{rel}(X(n))} \quad (16)$$

Figure 9:
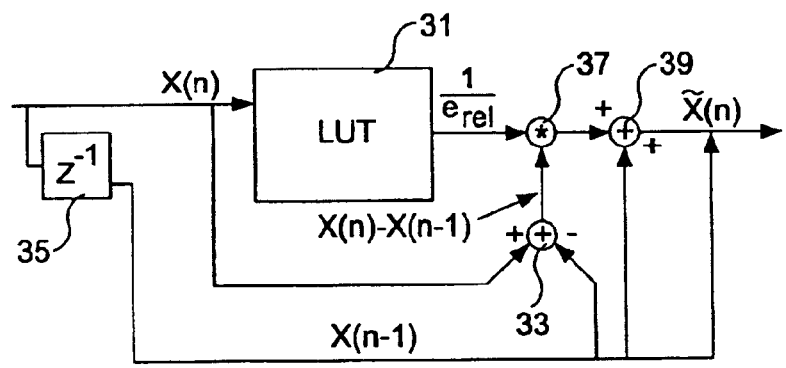
FIG. 9 is a block diagram illustrating a procedure for producing a modified input value to a digital-to-analog converter.

The values $1/e_{rel}(X)$ may be stored in a lookup table. Using this equation (16) a process for providing the adjusted values, $\tilde{X}(n)$ is obtained that is illustrated by the block diagram of FIG. 9. This process can in turn be performed in a device for correcting errors of the DAC as will be described hereinafter.

The input value X(n) is provided to a function block such as a look-up table (LUT) 31 to produce on the output thereof a value of the inverted value of the relative step error $e_{rel}$(X(n)). The input value is also provided to a first input of a first summing node 33 which on its second, sign-inverting input receives the previous or old input value X(n−1) that is stored in a memory or register 35. The output of the first summing node 33 is input to a multiplying node 37 that also receives the inverse of the relative step error $e_{rel}$(X(n)) from the function block 31. The value obtained in the node 37 by multiplying the values on the input terminals thereof is provided to a second summing node 39 that also receives the old input value X(n−1) from the register 15. The modified input value $\tilde{X}(n)$ is provided on the output terminal of the second summing node 39.

Figure 10:
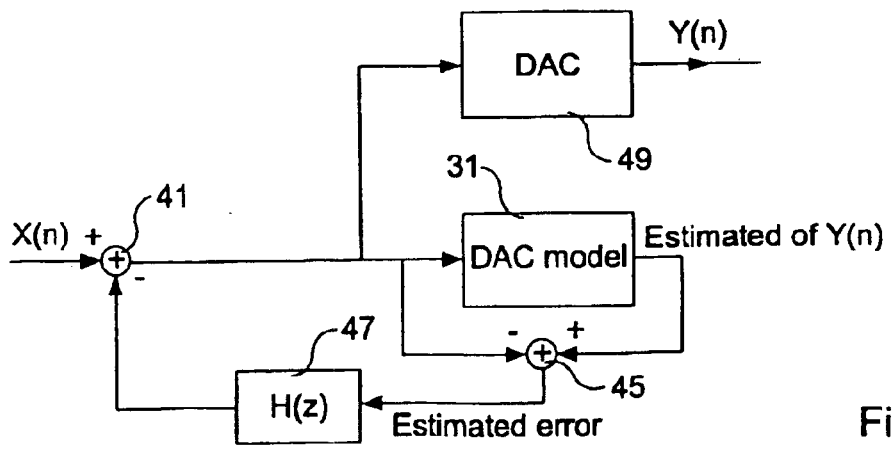
FIG. 10 is a block diagram of an error compensation method for a digital-to-analog converter according to prior art.

In K. O. Andersson, Niklas U. Andersson, and J. J. Wikner, "Spectral shaping of DAC nonlinearity errors through modulation of expected errors", Proc. IEEE International Symposium on Circuits and Systems (ISCAS'01), Vol. 3, pp. 417–420, Sydney, Australia, May 6–9, 2001, an error correction method based on delta-sigma modulation has been disclosed. The basic method used in this prior error correction method is schematically shown by the block diagram of FIG. 10. The idea of the prior method is to use an estimated error in a feedback loop to suppress nonlinear distortion within the signal band, to the cost of high-frequency distortion. This high-frequency distortion can be filtered out in the analog domain. The technique relies on a good model of the nonlinearity errors introduced by the DAC, such as that described above.

The input signal is provided to a first summing node 41, to which also a correction is provided on an inverting input. This correction is calculated using a DAC model block 43, that gives an estimate of the output signal. This estimate is provided to a second summing node 45 to which also the input signal is provided on an inverting input terminal. The second summing thus provides as output signal a estimate of the error. This estimated error passes a filter 47 having a transfer function and is provided as the correction to the first summing node 41. The corrected input signal is input to the DAC 49.

Figure 11A:
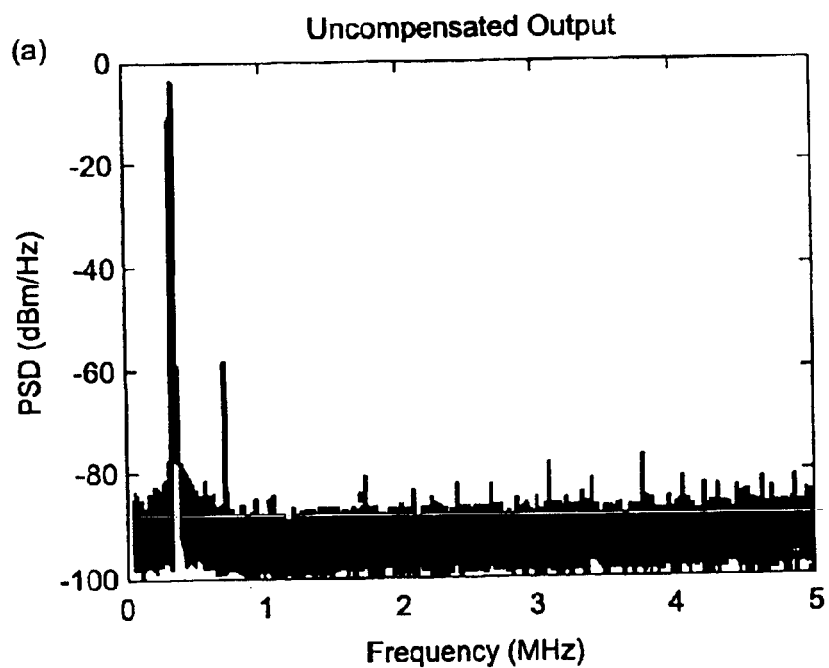
FIGS. 11a and 11b are diagrams of the output signal spectra as functions of the frequency for a digital-to-analog converter having no error compensation and having error compensation respectively.
Figure 11B:
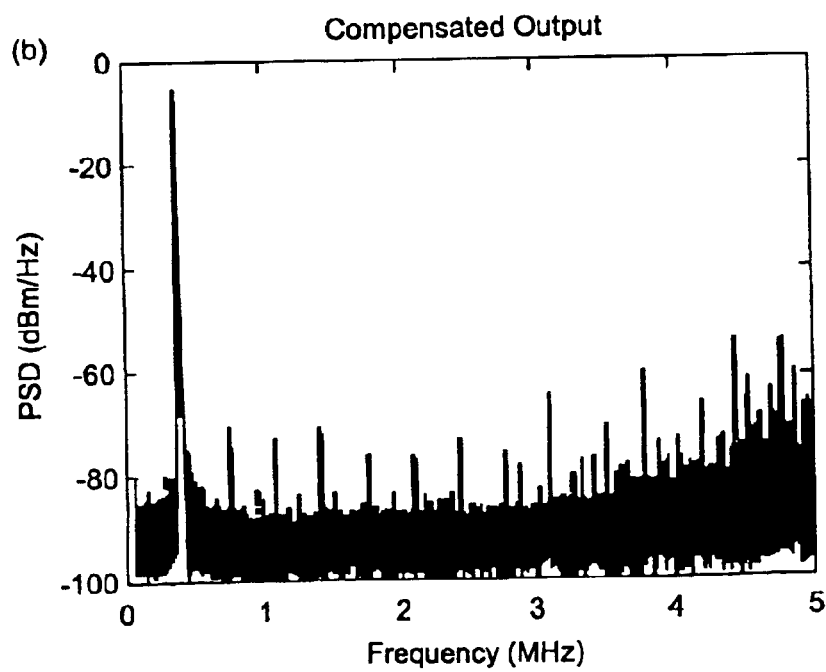

Some measured results will now be described to show the validity of the model in the real world. In FIGS. 11a and 11b examples of measured single-tone spectra with and without compensation are shown. The model used is a very simple version of the model according to FIG. 5. The lookup table contains only two values and is addressed by the MSB of the input signal. It is assumed that the relative error $e_{rel}$=0 when $X_{MSB}$=0 and $e_{rel}$=a when $X_{MSB}$=1 where a is some constant. Even though this is a coarse approximation, it can be observed in FIGS. 11a, 11b that the dominating spurious tone (the second harmonic) is reduced by 12 dB, to the cost of high-frequency distortion. The parameter a has been selected for the best possible performance.

Thus, a low complexity model has been described taking into account signal dependent settling errors due to parasitic components. The low complexity of the model makes it suitable for on-chip implementation for the use in error compensation techniques. The measurement results for the error compensation technique using the model demonstrate the usefulness of the model for error compensation. The absolute values of the relative step error that should be stored in the lookup table is different from circuit to circuit, and may, e.g., be achieved by simulation and/or online measurement of the output signal.

We claim:

1. A method of compensating errors in a digital-to-analog converter (DAC) generating output values, comprising the step of modifying input values for the DAC before entering the DAC, wherein the modifying is made to compensate for errors produced according to a model in which each output value of the DAC is a sum of a desired value directly proportional to a respective input value and an error being a product of a settled output value, which is the difference between the desired value and a previous output value actually provided by the DAC, and a relative step error that is a function only of the respective input value.

2. The method according to claim 1, wherein the relative step error is a function also of the previous output value.

3. The method according to claim 1, wherein the relative step error is a function also of the previous input value.

4. A digital-to-analog converter (DAC) having error correction, the DAC receiving at periodically repeated times on input lines input signals representing an input digital value and providing at an output line an output electrical signal, the magnitude of which represents the input digital value, the DAC comprising an error correction unit coupled to receive the input signals and to provide to the input lines modified input signals, wherein the error correction unit is arranged to provide the modified input signals so that a corrected output signal is provided, the correction being made to compensate errors produced according to a model in which each output signal of the DAC is a sum of a desired value directly proportional to a respective input signal and an error being a product of a settled output signal, which is the difference between the desired value and a previous output signal actually provided by the DAC, and a relative step error that is a function only of the respective input signal.

5. The DAC according to claim 4, wherein the model is arranged so that the relative step error is a function also of the previous output signal.

6. The DAC according to claim 4, wherein the model is arranged so that the relative step error is a function also of the previous input signal.

7. A method of compensating errors in a digital-to-analog converter (DAC) comprising the steps of providing sequential input values for the DAC to produce sequential output values;

modifying a respective input value before entering the DAC to compensate DAC errors defined as a product of a settled output value, which is the difference between a desired value and a previous output value actually provided by the DAC, and a relative step error that is a function only of the respective input signal.

8. The method according to claim 7, wherein the relative step error is a function also of the previous output signal.

9. The method according to claim 7, wherein the relative step error is a function also of a previous input signal.

* * * * *